(12) United States Patent
Foo et al.

(10) Patent No.: US 6,249,694 B1
(45) Date of Patent: Jun. 19, 2001

(54) METHOD FOR PERIPHERAL MR ANGIOGRAPHY

(75) Inventors: Thomas K. F. Foo, Rockville; Vincent B. Ho, North Bethesda, both of MD (US); Matthew A. Bernstein, Rochester, MN (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 09/118,411

(22) Filed: Jul. 17, 1998

(51) Int. Cl.$^7$ .................................................. A61B 5/055
(52) U.S. Cl. ............................................ 600/420; 324/309
(58) Field of Search ..................................... 600/407, 409, 600/410, 420, 425, 427; 324/307, 309, 300, 306; 424/9.3

(56) References Cited

U.S. PATENT DOCUMENTS 5,417,213 * 5/1995 Prince .................................. 600/420
5,422,576 * 6/1995 Kao et al. .............................. 324/309
5,590,654 * 1/1997 Prince .................................. 600/420
5,928,148 * 7/1999 Wang et al. .......................... 600/420

* cited by examiner

Primary Examiner—Marvin M. Lateef
Assistant Examiner—Ali M. Imam
(74) Attorney, Agent, or Firm—Skarsten Law Offices; Christian G. Cabou; Phyllis Y. Price

(57) ABSTRACT

A method of peripheral MR angiography is provided for imaging an artery or other vessel, wherein the vessel is of such length that MR data must be acquired at each of a plurality of scan stations spaced along the vessel. In accordance with the method, a contrast agent is intravenously injected, in order to provide a bolus which successively flows to each of the scan stations. After acquiring an initial subset of the MR data associated with a given scan station, the bolus is tracked to determine whether it has arrived at the next-following scan station. If so, at least some of the MR data associated with the next scan station are then acquired. However, if it is found that the bolus has not yet arrived at the next scan station, acquisition of further data at the given scan station is continued.

16 Claims, 5 Drawing Sheets

METHOD FOR PERIPHERAL MR ANGIOGRAPHY

BACKGROUND OF THE INVENTION

The invention disclosed and claimed herein generally pertains to magnetic resonance (MR) angiography, i.e., to MR imaging of an artery or like vessel carrying blood or other fluid. More particularly, the invention pertains to a method of the above type wherein MR data are acquired at each of a number of scan locations or stations, which are spaced along a vessel of comparatively great length. Even more particularly, the invention pertains to a method of the above type wherein an amount of contrast agent, or bolus, moves along the vessel or other conduit, from station-to-station, and measures are taken to ensure that MR data is acquired at a particular station only or substantially when the bolus is located there.

It is now a well known practice in MR angiography to insert a volume of contrast agent, such as gadolinium chelate, into blood flowing along a vessel. The volume or mass of contrast agent is referred to as a bolus, and has the effect of shortening the $T_1$ time of the blood. Thus, an MR image of the blood, acquired by a fast gradient echo or like technique, will show up very well with respect to adjacent stationary tissue of the vessel structure.

It is also well known that certain clinical assessments require imaging a vascular territory of comparatively great length. Using MR for these evaluations, therefore, necessitates the acquisition of MR data over several stations or scan locations, which are located at intervals along the vessel path of flow. To acquire data at a particular station, the patient is selectively positioned with respect to an MR scanner, typically by movement of a table supporting the patient. Data are then acquired from a series of slices taken through a region or section of the patient, which comprises the particular scan location or station. Thereafter, the patient is shifted, relative to the scanner, so that data may be acquired from another section of the patient, comprising another scan location or station. MR angiography employing this procedure in conjunction with an injection of a contrast bolus may be referred to as bolus chasing peripheral MR angiography.

At present, when a contrast agent is used in connection with a peripheral MR angiography exam, the first scan station is selected to be the section of the patient, along a vessel of interest, at which the bolus arrives first. When the scan at the first station is completed, the acquisition normally moves to the next scan station. However, the most appropriate time to move to the next station is not precisely known. For example, in the case of slow blood flow, the distal vasculature at the next scan station may not have had adequate time to fill with contrast material. On the other hand, if flow rate is greater than anticipated, the contrast agent may tend to move into stationary tissue adjacent to the next scan station, before data acquisition commences. In either case, contrast between moving fluid and stationary tissue may be significantly reduced at the next scan station. Moreover, undesirable effects, resulting either from flow rate which is too slow or too great, may tend to become progressively worse as imaging proceeds to subsequent scan stations, and as the total number of scan stations increases.

SUMMARY OF THE INVENTION

The invention is generally directed to a method of peripheral MR angiography for imaging structure associated with a vessel, such as a comparatively long artery within a patient, wherein MR data are to be acquired at each of a plurality of scan stations positioned along the vessel. The method includes the step of inserting a contrast agent into blood via intravenous injection, to provide a bolus which flows to first and second stations, in succession. The method further comprises acquiring an initial portion of a first MR data set associated with the first station, and monitoring the second station to determine whether the bolus has arrived there. If it is determined from the monitoring step that the bolus has in fact arrived at the second station, at least some of the MR data of a second data set associated therewith are then acquired. However, if it is determined that the bolus has not yet arrived at the second station, acquisition of further data at the first station is continued.

In a preferred embodiment of the invention, the portion of MR data initially acquired at the first scan location comprises central k-space data, and the vessel comprises an artery residing in an imaging subject. Moreover, an MR scanning device and a table supporting the imaging subject are associated with the MR method, the table being operated to selectively position the imaging subject with respect to the scanning device, in order to acquire the MR data sets respectively associated with the first and second scan stations.

In a useful embodiment of the invention, the monitoring step comprises placing an NMR monitoring means which is responsive to the contrast agent in closely spaced relationship with the vessel and proximal to the second station, and setting the monitoring means to generate a signal when the amount of contrast agent at the second station exceeds a specified threshold.

In another useful embodiment of the invention, the monitoring step comprises rapidly acquiring MR data from a region which is proximal to the vessel and also to the second scan station, and then rapidly re-constructing an image from the rapidly acquired data. An operator may then readily determine the amount of contrast agent at the second scan station simply by visual inspection of the rapidly acquired image.

OBJECTS OF THE INVENTION

An object of the invention is to provide a more optimum method for peripheral MR angiography, which is directed to an artery or other vessel of substantial length.

Another object is to provide a method of the above type, wherein data acquisition at each scan station, in a succession of scan stations spaced along the vessel, is substantially synchronized in time with arrival at the scan station of a bolus of contrast agent.

Another object is to provide a method of the above type which tracks arrival of the bolus at successive scan station along the vessel path of flow.

Another object is to provide a method of the above type, wherein an assessment is made as to whether the bolus has or has not moved from the current scan station to a subsequent scan station, and data acquisition either shifts to the subsequent station, or continues at the current station, in accordance with the assessment.

These and other objects and advantages of the invention will become more readily apparent from the following description, taken together with the accompanying drawings.

DETAILED DESCRIPTION OF THE PREFERRED EMBODIMENT

Figure 1:
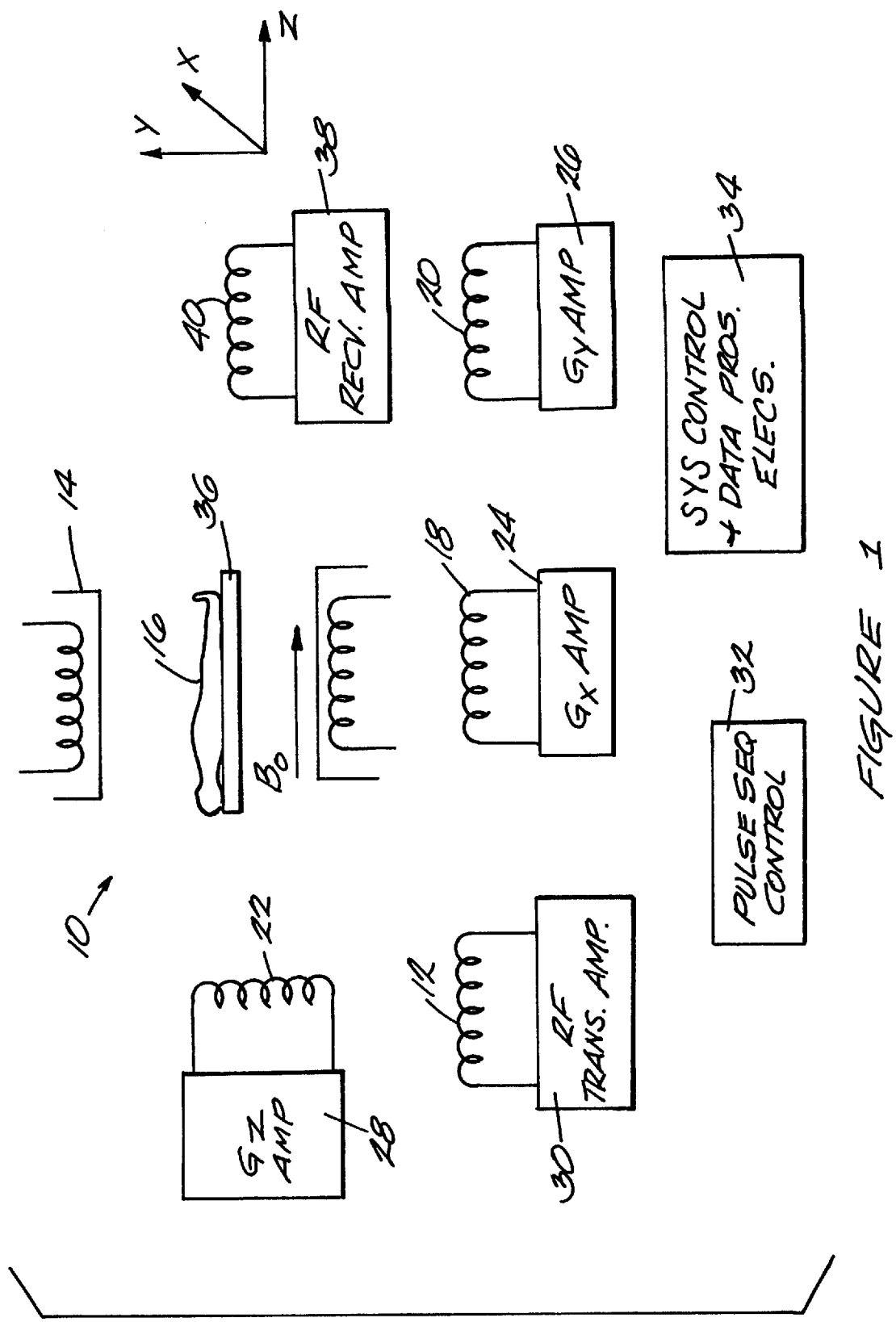
FIG. 1 is a schematic diagram showing basic components of an MR system for use in practicing embodiments of the invention.

Referring to FIG. 1, there are shown the basic components of an MR system or scanner 10 which may be operated to acquire MR data in accordance with the invention described herein. System 10 includes an RF transmit coil 12, as well as a cylindrical magnet 14 for generating a main or static magnetic field $B_o$ in the bore thereof. RF coil 12 is operated to transmit RF excitation signals into a patient or other subject of imaging 16 residing in the magnet bore, in order to produce MR signals. System 10 further includes gradient coils 18, 20 and 22 for generating $G_x$, $G_y$, and $G_z$ magnetic field gradients relative to orthogonal X-, Y- and Z-reference axes, respectively. FIG. 1 shows each of the gradient coils 18, 20 and 22 respectively driven by gradient amplifiers 24, 26 and 28, and RF coil 12 driven by transmit amplifier 30. FIG. 1 further shows an RF coil 40, which is operated in association with a receive amplifier 38 to acquire MR signals from subject 16. In some arrangements, coil 40 and coil 12 comprise the same RF coil, which is operated in alternate modes during the imaging sequence. System 10 is further provided with a pulse sequence control 32, which is operated to control the RF and gradient amplifiers, and to thereby generate pulse sequences to produce and acquire sets of MR signals. System 10 also includes system control and data processing electronics 34, for operating respective components of system 10 to acquire MR data, in accordance with the invention, and to construct images thereof. The construction, functions, and interrelationships of components of MR system 10 are well known and described in the prior art, such as in U.S. Pat. No. 5,672,969, issued Sep. 30, 1997 to Zhou et al.

Referring further to FIG. 1, there is shown subject 16 supported on a table 36 or the like, which may be slid or translated along the Z-axis of MR system 10. Thus, subject 16 may be selectively positioned within the bore of main magnet 14. The motion of the table is under computer control whose position along the Z-axis of the magnet bore can be precisely controlled and is reproducible.

Figure 2:
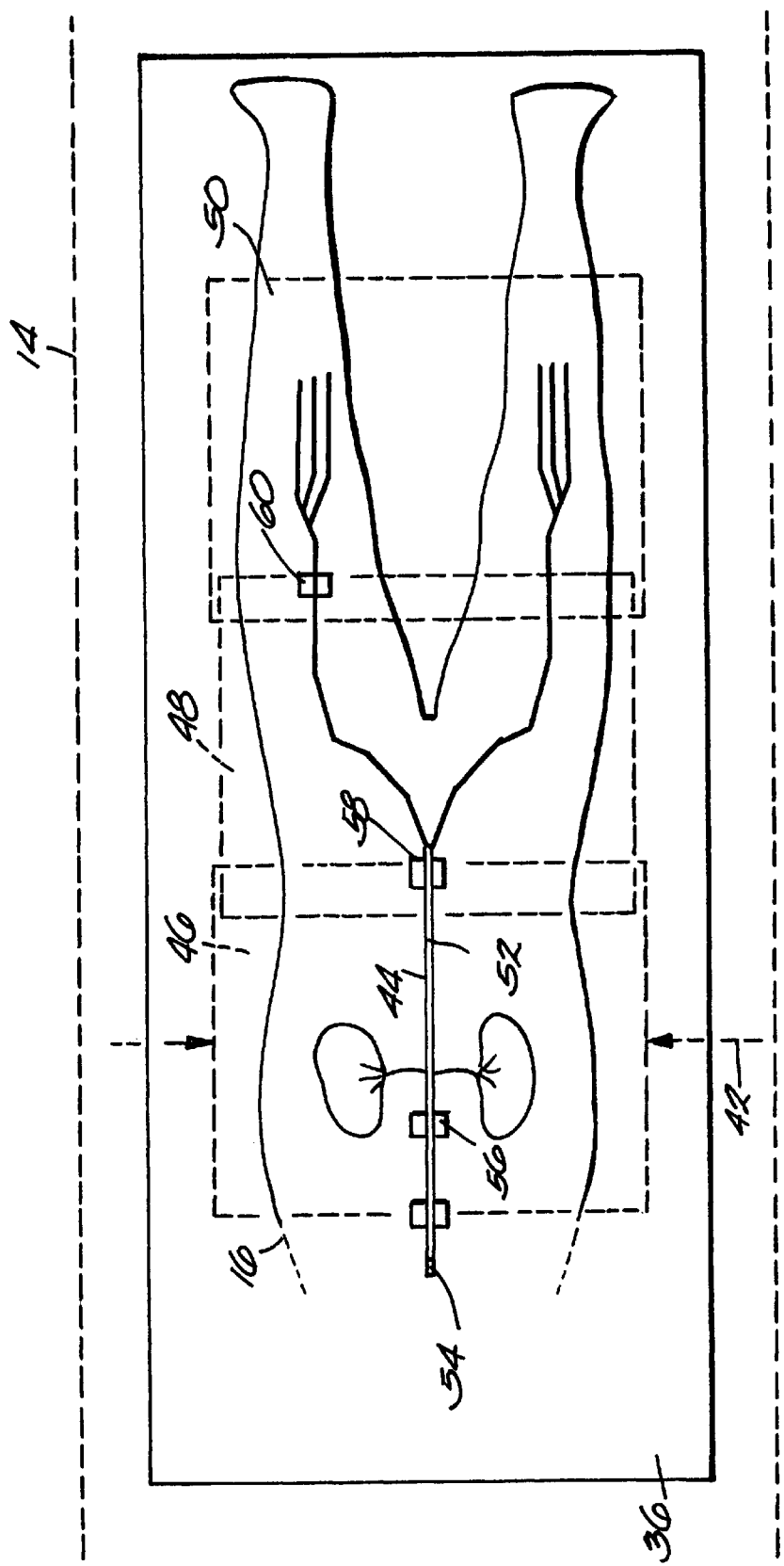
FIG. 2 is a schematic diagram illustrating an arrangement for conducting a peripheral MR angiography exam, in accordance with the invention.

Referring to FIG. 2, there is shown a more detailed view of subject 16, supported on table 36 within magnet 14. More specifically, FIG. 2 shows patient or subject 16 having a blood vessel or vascular territory 44 of substantial length. In this case, the clinical assessment of the peripheral arteries requires the imaging of an extended field of view which extends from the abdomen to the lower limbs of the subject. This evaluation includes portions of the abdominal aorta, iliac arteries, femoral arteries, popliteal arteries, tibioperoneal arteries and arteries of the foot. It is desired to acquire MR image data of the extended vascular territory 44 in its entirety. However, because of the substantial length of the vascular territory 44, it is necessary to obtain the data by establishing a plurality of scan locations or stations between subject 16 and components of MR system 10.

In accordance therewith, FIG. 2 shows scan stations 46, 48 and 50, each comprising a section or region of subject 16. More specifically, scan station 46 comprises the upper trunk area (abdomen) of subject 16, scan station 48 comprises the lower trunk area (pelvis/thigh) thereof, and scan station 50 comprises the lower extremities (calf/foot) thereof. To acquire MR data associated with a particular scan station, table 36 is moved to position the particular scan station in specified relationship with main magnet 14. For example, FIG. 2 shows the midpoint of scan station 46 positioned at isocenter 42 of magnet 14.

In a conventional arrangement, an entire set of MR data, pertaining to the segment of vessel 44 lying within scan station 46, would be acquired while such scan station was in the position shown in FIG. 2. Then, table 36 would translate subject 16 leftward, as viewed in FIG. 2, to position the midpoint of scan station 48 at isocenter 42. After scanning an entire set of data pertaining to the segment of vessel 44 within scan station 48, subject 16 would be further translated, to position the midpoint of scan station 50 at isocenter 42. A set of data pertaining to scan station 50 would then be scanned, to complete the data acquisition procedure. It will be noted from FIG. 2 that a certain amount of over-lap can occur between adjacent scan stations.

As stated above, it is common practice in MR angiography to intravenously inject a contrast agent, such as 20 cc of gadolinium chelate, into blood 52 flowing through vessel 44. This provides a bolus 54 therein. If vessel 44 carries blood from the upper body to the lower limbs of subject 16, the flow direction is from left to right, as viewed in FIG. 2. After passing through the cardiac and the pulmonary circulations, the bolus 54 would arrive first at scan station 46, then arrive at scan station 48, and finally arrive at scan station 50.

In accordance with a conventional technique known commercially as SMARTPREP (as described in Foo T K F; Saranathan M; Prince M R; Chenevert T L. Automated detection of bolus arrival and initiation of data acquisition in fast, three dimensional, gadolinium-enhanced MR angiography. *Radiology* 1997; 203: 275–280) by the General Electric Company, a monitor 56 is placed proximate to vessel 44, upstream to the arterial blood flow for the field-of-view that constitutes scan station 46, an example of which is shown in FIG. 2. The monitor 56 periodically detects MR signal excited in a small volume or region of vessel 44 (not shown in FIG. 2) which is in closely spaced relationship with monitor 56. The detected MR signal will reach a specified threshold level when the contrast agent enters the portion or segment of vessel 44 lying within scan station 46. Thereupon, scanning of station 46 commences. When such scan is completed, the MR system will sequentially proceed to acquire data from scan station 48, and then from scan station 50.

As indicated above, the time required for the bolus 54 to move from one scan station to the next is not precisely known and varies from patient-to-patient. Variations in bolus delivery can have a significant impact on MR image data. Acquiring the MR data prior to the bolus arrival into the target artery will result in poor (or no) visualization of the artery. Similarly, acquiring the data after the passage of the bolus can result in less than optimal visualization of the target artery. Inaccurate bolus timing (i.e. one's ability to coordinate the bolus with the MR data acquisition), therefore, could significantly diminish the benefits—and efficacy—of using a contrast agent in conventional scan techniques as described above or require the use of increased quantities or dose of the gadolinium chelate contrast material. Thus, in order to overcome such disadvantages, and in accordance with an embodiment of the invention, monitors 58 and 60 are placed in closely spaced relationship with vessel 44, at the positions respectively shown therefore in FIG. 2. More specifically, monitor 58 is positioned just to the right of the leftward edge of scan station 48, and monitor 60 is positioned just to the right of the leftward edge of scan station 50, as viewed in FIG. 2. Thus, monitors 58 and 60 will detect arrival of bolus 54 at scan stations 48 and 50, respectively. Monitors 58 and 60 may be similar to monitor 54 in operation and construction. Also, baseline data is obtained for each monitor, prior to acquisition of image data for the angiography exam. The baseline data indicates the level of MR signals detected by respective monitors, in the absence of contrast agent. From such data, a threshold level may be pre-set for each monitor, to indicate arrival of the bolus at the corresponding scan location.

Note that in order to monitor the signal at locations 58 or 60 while acquiring data from 46 or 48, respectively, the table may also move in order to better visualize 58 or 60. Furthermore, moving the table will minimize geometric distortion from having 58 or 60 at the edge of a large image FOV.

By tracking the progress of bolus 54 along vessel 44, as described hereinafter in further detail, the method of the invention is able to immediately acquire the most pertinent image data at a scan station, upon detecting arrival of the bolus at such station. Moreover, the method enables data acquisition to continue at a scan station, while the bolus is in transit to the next-following station. Thus, the method of the invention optimizes use of contrast agent in peripheral MR angiography.

Figure 3:
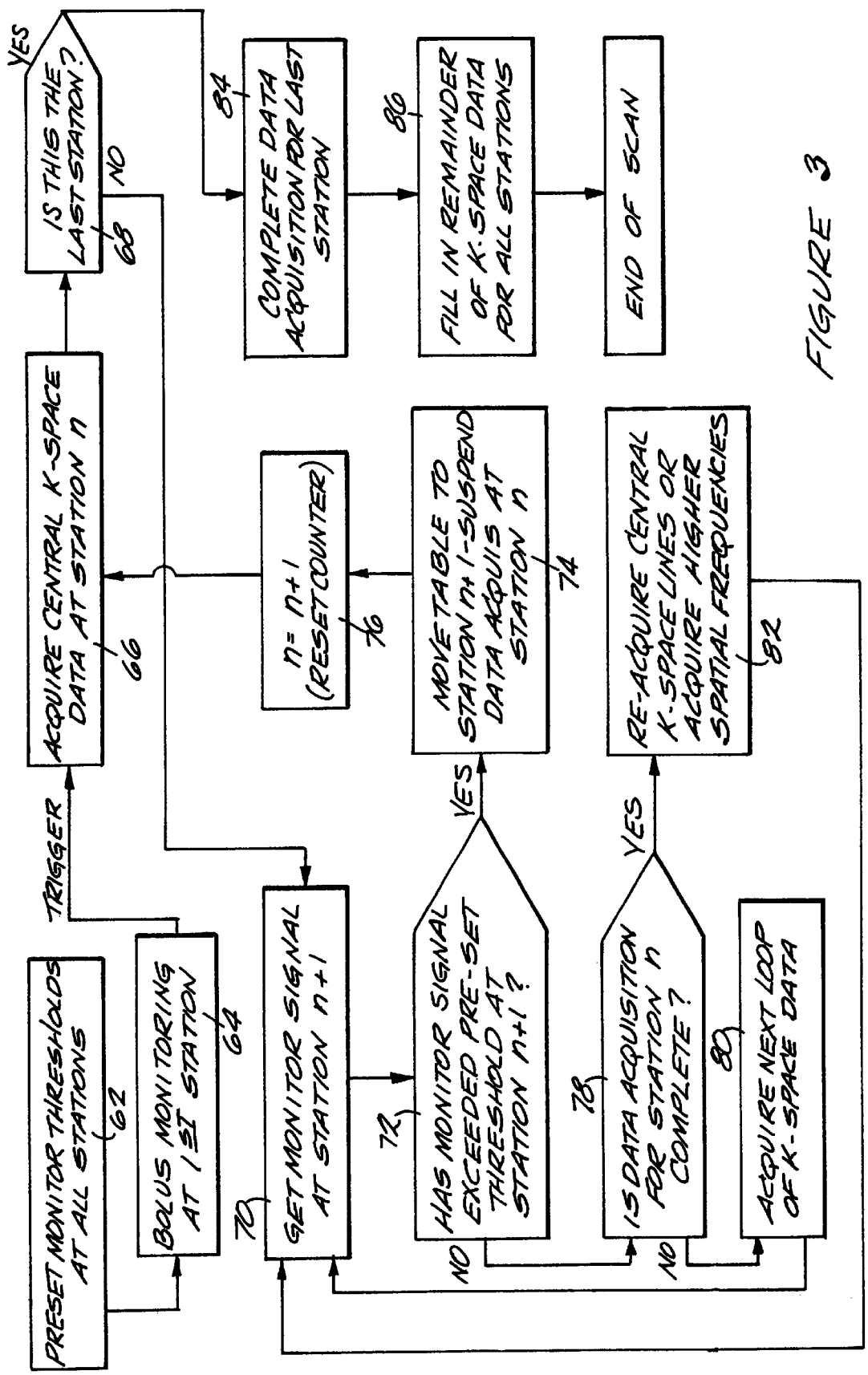
FIG. 3 is a flow chart illustrating an embodiment of the invention.

Referring to FIG. 3, there is shown a flowchart illustrating use of monitors 56–60 in a method comprising an embodiment of the invention. In accordance with process blocks 62 and 64, the threshold levels of respective monitors are initially pre-set, and monitor 56 is operated to detect the arrival of bolus 54 at the first scan station, i.e., at scan station 46. Thereupon, a trigger signal is generated to commence acquisition of image data, in regard to the segment of vessel 44 lying within each of the n scan stations. While FIG. 2 shows only three scan stations, it will be readily apparent that in other embodiments the number of scan stations n may be substantially greater. Moreover, as emphasized by process block 66 of FIG. 3, initial data acquisition at each scan station, including the very first station, is limited to central k-space data, i.e., to k-space data of lower spatial frequencies. Such data is most significant in image reconstruction, and is usefully acquired over a period of approximately 5–10 seconds.

After acquisition of the central k-space data for the nth scan station, a determination is made as to whether such nth scan station is the final station in the imaging sequence, in accordance with decision block 68. If not, the monitor signal for scan station n+1 is detected, to determine whether bolus 54 has arrived there, as collectively indicated in FIG. 3 by process block 70 and decision block 72. If bolus 54 has reached scan station n+l, table 36 operates to move subject 16, as previously described, so that data acquisition can commence at scan station n+1. Such operation is indicated by process block 74, which is followed by resetting an associated counter (not shown) from n to n+1, in accordance with process block 76. Thereupon, central k-space data is acquired at the updated scan station, in accordance with process block 66.

If it is decided at block 72 that the bolus has not yet reached scan station n+1, a determination in accordance with decision block 78 must be made. That is, it must be determined whether data acquisition for the nth scan station has been completed. If not, the next loop of k-space data required for scan station n is acquired, as indicated by process block 80. However, if data acquisition has been completed, the operation of process block 82 is carried out, that is, central k-space data is reacquired for the nth scan station, in order to improve signal to noise ratio. Alternatively, data is acquired at higher spatial frequencies, to increase spatial resolution. When the operation of either process block 80 or process block 82 has been completed, the system returns to process block 70, to once again test for arrival of the bolus at scan station n+1.

Referring further to FIG. 3, process block 84 requires that data acquisition be completed for the last scan station, after such scan station has been identified by decision block 68. Then, in accordance with process block 86, all remaining k-space data, which has not yet been acquired, is obtained for respective scan stations. The operation of process block 86 would generally require controlled movement of table 36, to selectively position the subject 16. When acquisition of the remaining data has been completed, the scanning procedure of FIG. 3 comes to an end. It will be readily apparent that the respective steps and procedures of the embodiment, as described herein and shown in FIG. 3, could readily be implemented by configuring control electronics 34 to direct operation of system 10 in accordance therewith.

In the embodiment of the invention described above, a problem may be encountered in placing a monitor over a small volume within a vessel of interest. As shown in FIG. 2, a monitor and its associated volume are located near the edge of a scan station, and are therefore at the edge of the imaging field of view. As a result, the monitor volume may be spaced so far from the magnet isocenter that it is affected by gradient non-linearities.

Figure 4:
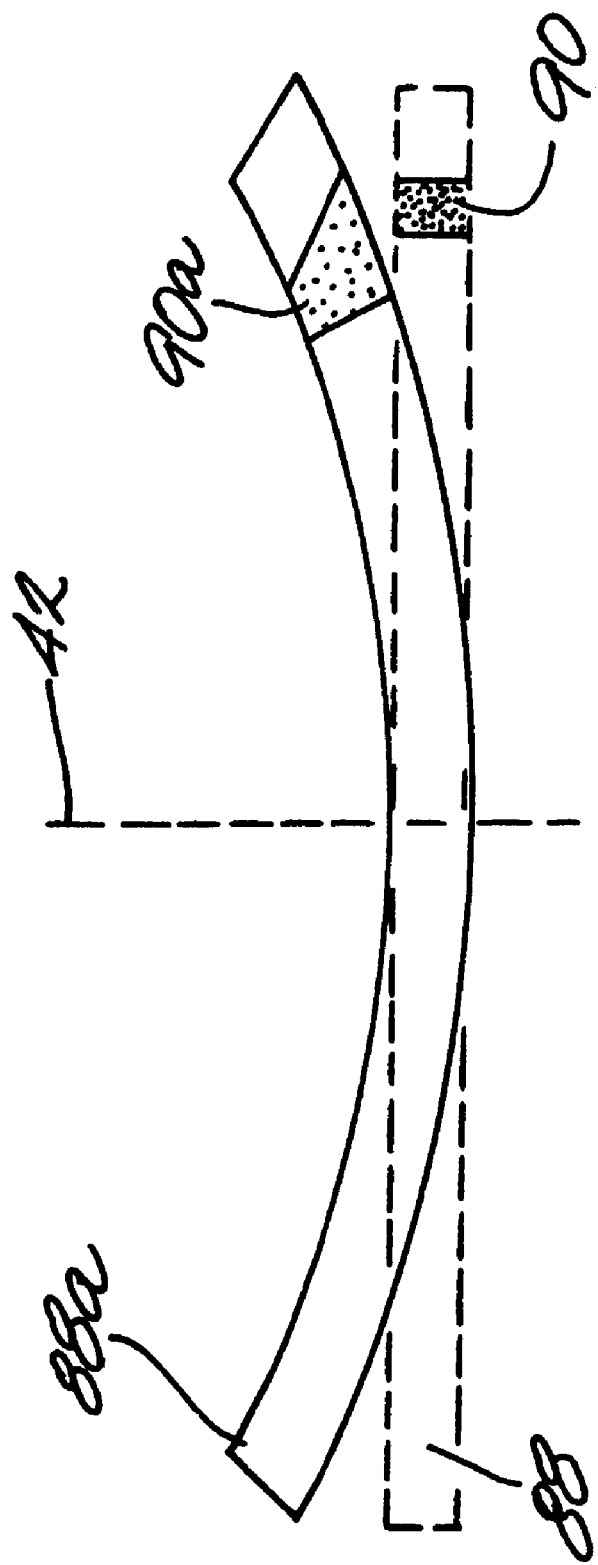
FIG. 4 is a schematic diagram illustrating effects of gradient non-linearity in connection with the embodiment of FIG. 3.

Referring to FIG. 4, there is shown an ideal slice selective slab 88, which is taken through vessel of interest 44, and is intended to supply MR signal data for constructing an image. Slab 88 includes a volume 90, comprising a small region along the path of blood flow which is adjacent to one of the monitors. FIG. 4 further shows the slice selective slab 88a from which the MR signal data is actually acquired. Because of gradient field non-linearity distal from isocenter 42, the ends of slab 88a curve away from the intended positions thereof. Accordingly, the actual position of monitor volume 90a is displaced from intended volume position 90. As a result, the frequency offsets corresponding to the monitor slabs may be incorrect. This can be compensated for by using the gradient parameters of a technique known in the art as GRADWARP to pre-calculate the field distortion. In the current method, the slice selection frequency offsets and slice selection gradient amplitude may then be changed in accordance therewith. This allows the prescribed monitor volume to better match the expected position. The GRADWARP technique is described in the prior art, such as in U.S. Pat. No. 4,698,591, issued Oct. 6, 1987 to Glover, et. al.

Another method to correctly localize the monitor volume is to use the saturation effect of the slice selective RF pulses (either a spin echo orthogonal slice selective gradient or 2-dimensional (2D) cylindrical RF pulse). The saturation region would indicate the position of the monitor volume. The correct position can be quickly identified by preceding a real-time acquisition sequence with a tracking or monitor volume selection pulse sequence. Thus, a user can move about or around the desired station, and adjust the monitor volume frequency offsets accordingly.

Figure 5:
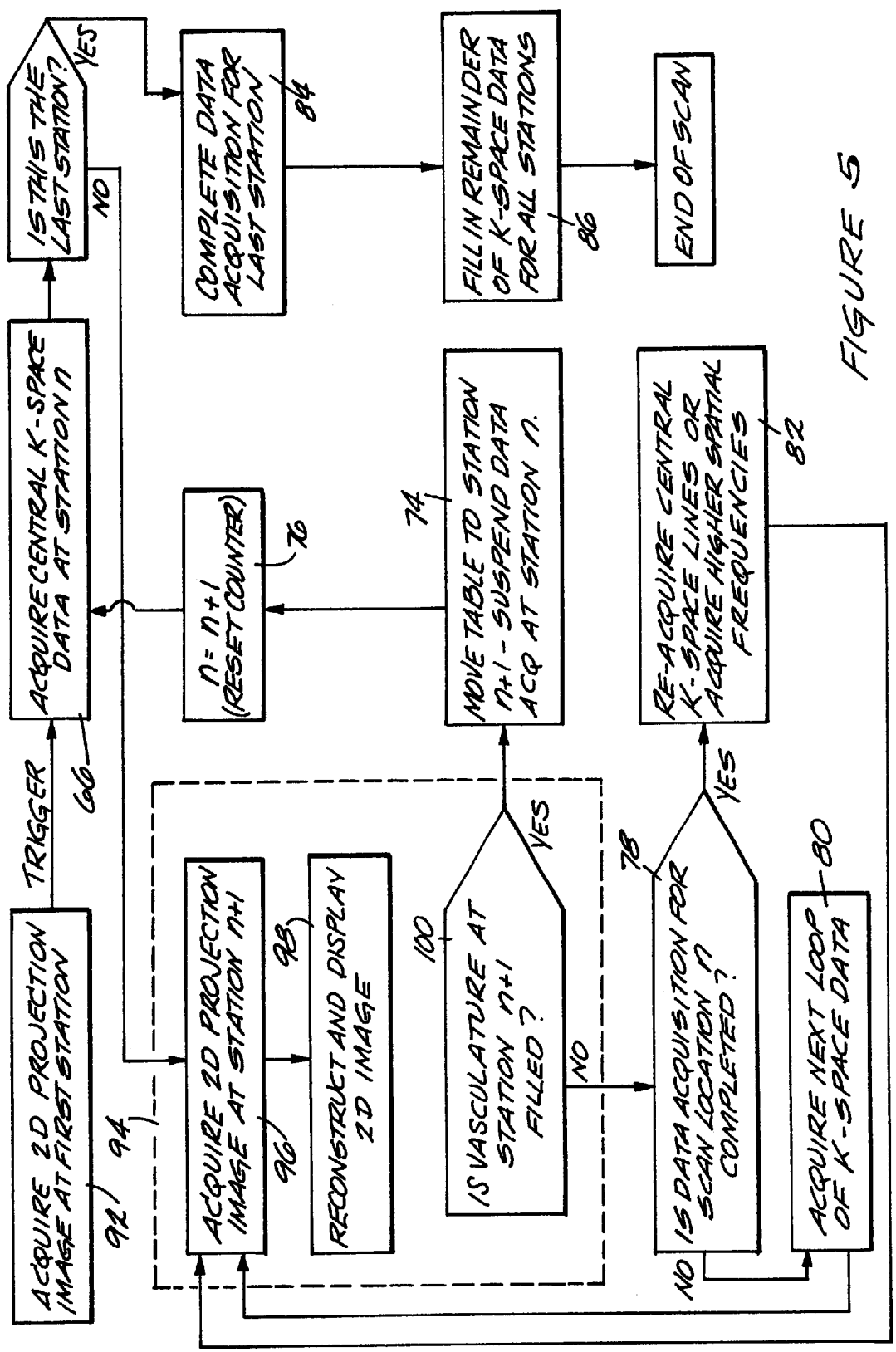
FIG. 5 is a flow chart illustrating an alternative embodiment of the invention.

Referring to FIG. 5, there is shown a flow chart illustrating an embodiment of the invention, wherein alternative means are used to detect the arrival of the bolus at respective scan stations. Thus, the need for monitors such as monitors 56–60, as well as drawbacks associated therewith, are substantially eliminated. This is similar to the method described by Wilman A H; Riederer S J; et al. Fluoroscopically triggered contrastenhanced three-dimensional MR angiography with elliptical centric view order: application to the renal arteries. *Radiology* 1997; 205:137–46.

As shown by process block 92, the method of FIG. 5 commences by periodically acquiring short 2D projection images of the first scan station, i.e., scan station 46. An operator of MR system 10 physically views respective images until he sees the vasculature filled with contrast agent at such scan station. Thereupon, he triggers acquisition of central k-space data at the first scan station, in accordance with process block 66, which is identical to process block 66 described above in connection with FIG. 3. The following decision block 68 is likewise identical to decision block 68 of FIG. 3. Thus, after acquiring the central k-space data for any scan station other than the last station, a bolus tracking function, represented by block 94, is initiated. Such function comprises process blocks 96 and 98 and decision block 100.

In accordance therewith, and following the acquisition of central k-space data for the nth station, at the end of each $k_z$ encoding loop (in a 3D fast GRE acquisition) a short 2D projection image (preferably using an echo-train or similar pulse sequence of 100–200 milliseconds acquisition time) is acquired at scan station n+1 (process block 96). The $k_y$ encoding value is then updated, and the next $k_z$ loop data is acquired. Thus, for each $k_y$ encoding value, a fast acquisition is performed at the next scan station. The fast 2D projection image is reconstructed and displayed in real-time, at intervals of ($T_{acq}+n_z TR$), in accordance with process block 98. $T_{acq}$ is the acquisition time of the fast 2D image, and $n_z$ is the number of slice encoding values. In accordance with decision block 100, the operator observes the displayed 2D image to determine whether the vasculature at the scan station n+1 has filled with contrast material. If so, data acquisition will move to scan station n+1. Otherwise, data acquisition will continue at scan station n, in accordance with decision block 78 and process blocks 80 and 82, described above in connection with FIG. 3. The remaining blocks shown in FIG. 5 are likewise identical to the corresponding blocks previously described in connection with FIG. 3.

It is thus seen that in the method of FIG. 5, visual monitoring of the vasculature at scan station n+1 begins only after a central core of k-space data has been acquired for scan station n. This insures that data at the current scan station has sufficient contrast between the vasculature and the stationary tissue. The acquisition of the fast 2D projection image at scan station n+1 may be accomplished in one of two ways. The first is to completely move table 36 to position subject 16 at scan station n+1. The second is to move the table part way toward such scan station. The procedure of choice will generally depend on table motion speed.

Note that the above two approaches or embodiments can also be combined to provide both a visual and automated method for detection of the contrast bolus arrival, as described by Kim J; Farb G; Wright G; Sentinel scan: Test bolus examination in the carotid artery at dynamic gadolinium enhanced MR angiography. *Radiology* 1998; 206:283–289.

Obviously, many other modifications and variations of the present invention are possible in light of the above teachings. It is therefore to be understood that within the scope of the disclosed concept, the invention may be practiced otherwise than as specifically described.

What is claimed is:

1. A method of peripheral MR angiography for imaging structure pertaining to a vessel, wherein MR data are to be acquired at each of a succession of scan stations positioned along the vessel or vascular territory, said succession including at least first and second scan stations, said method comprising the steps of:

intravenously injecting a contrast agent, to provide a bolus disposed to flow to said first scan station, and to thereafter flow to said second scan station;

acquiring an initial portion of a first set of MR data associated with said first scan station;

monitoring said second scan station to determine whether said bolus has arrived at said second scan station;

acquiring at least some of the data of a second MR data set associated with said second scan station, if it is determined from said monitoring step that said bolus has arrived at said second scan station;

suspending acquisition of said first MR data set at said first scan station, if it is determined from said monitoring step that said bolus has arrived at said second scan station; and continuing to acquire data of said first MR data set, if it is determined from said monitoring step that said bolus has not yet arrived at said second scan station.

2. The method of claim 1 wherein:

said initial portion of said first set of MR data comprises central k-space data.

3. The method of claim 2 wherein said monitoring step comprises:

placing an MR detector responsive to said contrast agent proximate to each of said scan stations, each of said detectors being in closely spaced relationship with said vessel and disposed to detect MR signal excited in a small volume of said vessel; and setting each of said detectors to generate a signal when the amount of said contrast agent at its corresponding proximate scan station exceeds a specified threshold.

4. The method of claim 2 wherein said monitoring step comprises:

rapidly acquiring MR data from a region proximate to said vessel and to said second scan station; and constructing a real-time image from said rapidly acquired MR data for use by an operator to determine whether vasculature at said second scan station has become filled with said contrast agent.

5. The method of claim 2 wherein said monitoring step comprises:

placing an MR detector responsive to said contrast agent in closely spaced relationship with said vessel and proximate to said second scan station;

setting said detector to generate a signal when the amount of said contrast agent at said second scan station exceeds a specified threshold;

rapidly acquiring MR data from a region proximate to said vessel and to said second scan station and constructing a real-time image therefrom; and detecting a signal generated by said detector and visually observing said rapidly acquired image, in combination, to determine arrival of said bolus at said second scan station.

6. The method of claim 2, wherein said vessel comprises an artery residing in an imaging subject, an MR scanning device and a table supporting said imaging subject being associated with said method, and wherein:

said table is operated to selectively position said imaging subject with respect to said scanning device, in order to acquire MR data associated with a given one of said scan stations.

7. A method for acquiring an MR image of a vessel within a subject, wherein the vessel is of such length that MR data must be acquired at each of a succession of scan stations spaced along the vessel, said method comprising the steps of:

injecting a contrast agent into said vessel, to provide a bolus disposed to flow successively to each of said stations;

establishing relative movement between said subject and an MR scanning device to successively enable each of said stations to acquire MR data;

upon enabling a given one of said stations other than the last station in said succession, acquiring an initial portion of a first MR data set associated with said given station;

monitoring the station next following said given station in said succession, to determine whether said bolus has arrived at said next following station; and enabling said next following station and acquiring an initial portion of a second MR data set associated therewith, while suspending acquisition of said first data set at said given station, if it is determined from said monitoring step that said bolus has arrived at said next following station, and otherwise acquiring further data of said first data set at said given station.

8. The method of claim 7 wherein:

said initial portions of said first and second data sets respectively comprise central k-space data.

9. The method of claim 8 wherein:

said acquired further data of said first data set comprises reacquired central k-space data, and k-space data of higher spatial frequencies, selectively.

10. The method of claim 9 wherein:

upon enabling said last station, a complete set of MR data associated therewith is acquired; and data acquisition is thereafter completed at each of the other stations in said succession.

11. The method of claim 7 wherein said subject is supported upon a moveable table, and wherein:

said table is operated to selectively position said subject with respect to said scanning device, in order to successively enable each of said stations to acquire MR data.

12. The method of claim 7 wherein said monitoring step comprises:

placing an MR monitoring means responsive to said contrast agent in closely spaced relationship with said vessel, and proximate to each of said stations; and setting the monitoring means proximate to a particular station to generate a signal, when the amount of said contrast agent at said particular station exceeds a specified threshold.

13. The method of claim 7 wherein said monitoring step comprises:

rapidly acquiring MR data from a region proximate to said vessel and to said next following station; and constructing a real-time image from said rapidly acquired MR data for use by an operator to determine whether vasculature at said next following station has become filled with said contrast agent.

14. The method of claim 13 wherein:

said real-time image comprises a fast two-dimensional projection image.

15. The method of claim 13 wherein:

said step of acquiring MR data from a region proximate to said vessel includes employing a gradient non-linearity compenasation technique to determine the actual location of said region.

16. The method of claim 15 wherein:

said compenasation technique comprises a GRADWARP technique.

* * * * *